United States Patent
Fujita

(10) Patent No.: US 8,800,337 B2
(45) Date of Patent: Aug. 12, 2014

(54) LEAD PIN CORRECTION DEVICE AND LEAD PIN CORRECTION METHOD

(75) Inventor: Shigeru Fujita, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 106 days.

(21) Appl. No.: 13/593,341

(22) Filed: Aug. 23, 2012

(65) Prior Publication Data

US 2013/0047693 A1    Feb. 28, 2013

(30) Foreign Application Priority Data

Aug. 29, 2011    (JP) .................. 2011-186268

(51) Int. Cl.
*H01J 23/213*    (2006.01)
*H01J 23/16*    (2006.01)

(52) U.S. Cl.
USPC ............... 72/125; 140/147; 140/105; 72/296; 72/316; 72/386

(58) Field of Classification Search
USPC ............ 140/105, 123, 147; 72/296, 308, 311, 72/316, 386, 387, 125; 29/766
See application file for complete search history.

(56) References Cited

U.S. PATENT DOCUMENTS

| | | | | |
|---|---|---|---|---|
| 2,971,555 A | * | 2/1961 | Paulson | 140/147 |
| 3,700,011 A | * | 10/1972 | Walter | 140/147 |
| 4,371,013 A | * | 2/1983 | Camp | 140/147 |
| 4,397,341 A | * | 8/1983 | Kent | 140/147 |
| 4,719,695 A | * | 1/1988 | Sturner | 140/147 |
| 4,895,189 A | * | 1/1990 | Alemanni | 140/147 |
| 8,056,386 B2 | * | 11/2011 | Ou et al. | 72/386 |

FOREIGN PATENT DOCUMENTS

| | | |
|---|---|---|
| JP | 59-194458 | 11/1984 |
| JP | 2002-222907 | 8/2002 |
| JP | 3989236 | 10/2007 |

* cited by examiner

*Primary Examiner* — David B Jones
(74) *Attorney, Agent, or Firm* — Cooper & Dunham LLP

(57) ABSTRACT

A lead pin correction device includes a holding unit holding an electronic device having lead pins; a pressing unit pressing the electronic device held by the holding unit in an extending direction of the lead pins; and a correction fixture including holes having a shape corresponding to a shape of the lead pins after correction. Further, the shape of the lead pins is corrected so as to fit the shape of the holes by inserting the lead pins into the holes by pressing the electronic device with the pressing unit while distal ends of the lead pins are inserted into the holes, the electronic device being held by the holding unit.

8 Claims, 10 Drawing Sheets

US 8,800,337 B2

LEAD PIN CORRECTION DEVICE AND LEAD PIN CORRECTION METHOD

CROSS-REFERENCE TO RELATED APPLICATIONS

The present application claims priority under 35 U.S.C. §119 to Japanese Patent Application No. 2011-186268 filed Aug. 29, 2011, the entire contents of which are hereby incorporated herein by reference.

BACKGROUND OF THE INVENTION

1. Field of the Invention

The present invention generally relates to a lead pin correction (bending) device and a lead pin correction (bending) method.

2. Description of the Related Art

There has been a known method of bending lead pins of a CAN-type optical device by setting the correction device so that the lead is inserted into the correction device, holding the root of the lead pins with the clamp section of the CAM-type LD package clamp mechanism, and displacing (bending) the lead pin (see for example, Japanese Patent Laid-open Publication No. 2002-222907).

SUMMARY OF THE INVENTION

According to an aspect of the present invention, a lead pin correction device includes a holding unit holding an electronic device having lead pins; a pressing unit pressing the electronic device held by the holding unit in an extending direction of the lead pins; and a correction fixture including holes having a shape corresponding to a shape of the lead pins after correction. Further, the shape of the lead pins is corrected so as to fit the shape of the holes by inserting the lead pins into the holes by pressing the electronic device by the pressing unit while distal ends of the lead pins are inserted into the holes, the electronic device being held by the holding unit.

BRIEF DESCRIPTION OF THE DRAWINGS

Other objects, features, and advantages of the present invention will become more apparent from the following description when read in conjunction with the accompanying drawings, in which.

DETAILED DESCRIPTION OF THE PREFERRED EMBODIMENTS

In the method (as described in Japanese Patent Publication No. 2002-222907) of related art, it is required to hold the root part of the lead pin of the CAN type optical device with a clamp section so as to reduce the load applied to the root section when the lead pin is corrected (bent). Therefore, the structure of the lead pin correction (bending) device becomes complicated due to the existence of the clamp section, and the cost increases accordingly.

Additionally, in the method of related art, the lead pins have their shape corrected (bent, changed) one by one. Therefore, the efficiency of correcting (bending) the lead pins is also low.

As described above, in the method of related art, it is not possible to effectively (promptly) correct (bend) the lead pins of the optical device.

The present invention is made in light of the problem, and may provide a lead pin correction (bending) device and a lead pin correction (bending) method having enhanced efficiency.

According to an embodiment, it may become possible to effectively correct (bend) the lead pins.

In the following, a lead pin correction (bending) device and a lead pin correction (bending) method according to embodiments are described.

Figure 1:
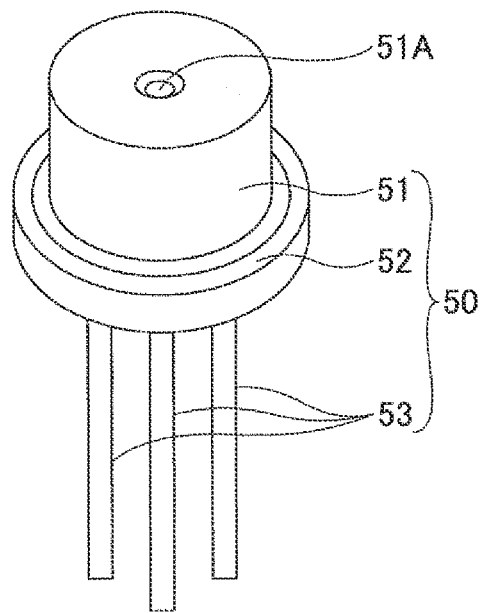
FIG. 1 is a drawing illustrating a sample semiconductor laser device having lead pins to be bent with a lead pin correction (bending) device according to an embodiment.

FIG. 1 illustrates a semiconductor laser device having the lead pins to be corrected (bent) by the lead pin correction (bending) device according to an embodiment.

As shown in FIG. 1, a semiconductor laser device 50 includes a laser section 51, a stem section 52, and three lead pins 53.

The laser section 51 includes one semiconductor laser chip so as to emit laser light from an emission hole 51A of the semiconductor laser device 50. The semiconductor laser chip is mounted on the stem section 52. Namely, the part sealing the semiconductor laser chip with a cover corresponds to the laser section 51.

The stem section 52 includes a heat sink or the like. The laser section 51 is mounted on the stem section 52. The stem section 52 may be made of a metal or resin.

The lead pins 53 are made of copper or the like, and are connected to the semiconductor laser chip via the stem section 52. Three lead pins 53 correspond to a power input line, a ground line, and a voltage input line to drive the semiconductor laser chip.

FIG. 1 exemplarily illustrates a case where the semiconductor laser device 50 includes only one semiconductor laser chip. However, the semiconductor laser device 50 may include two or more semiconductor laser chips. In this case, the number of the lead pins is increased by one for each of the increased number of the semiconductor laser chips.

Figure 2A:
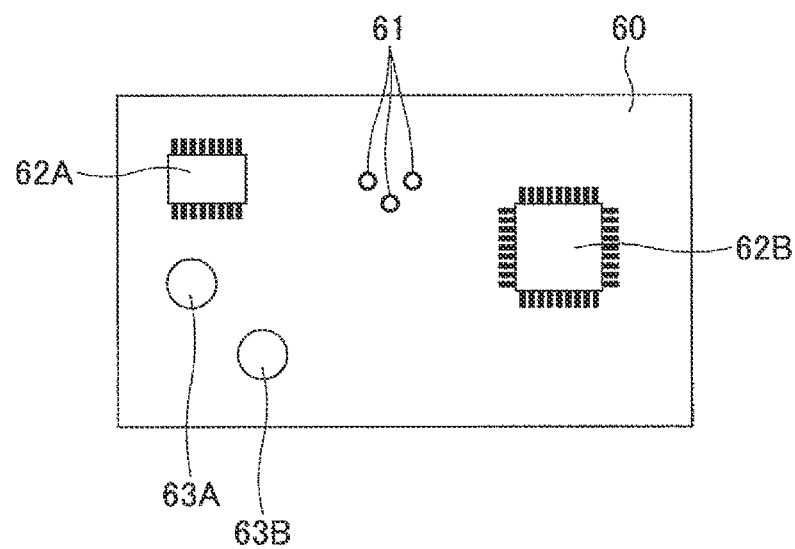
FIG. 2A is a drawing illustrating a sample printed-circuit board into which the lead pins of the semiconductor laser device of FIG. 1 are inserted.
Figure 2B:
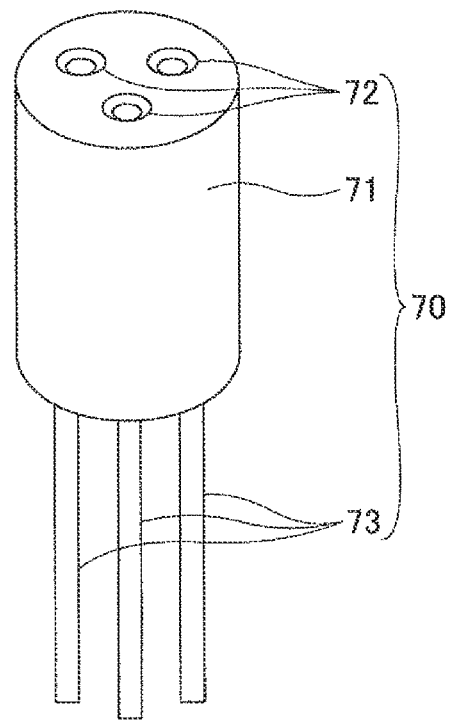
FIG. 2B is a drawing illustrating a sample socket having connectors where the lead pins of the semiconductor laser device are inserted.

FIG. 2A is a top view of a printed-circuit board on which the semiconductor laser device 50 is to be mounted. FIG. 2B is a perspective view of a socket to which the lead pins 53 are to be connected.

As illustrated in FIG. 2A, a printed-circuit board 60 on which the semiconductor laser device 50 is to be mounted includes three through-holes 61 into which the lead pins 53 of the semiconductor laser device 50 are to be inserted. Further, Integrated Circuit (IC) chips 62A and 62B, and capacitors 63A and 63B are mounted on the printed-circuit board 60.

The lead pins 53 of the semiconductor laser device 50 are inserted into the through-holes 61 after the shapes of the lead pins 53 are corrected (bent) by the lead pin correction (bending) device according to an embodiment. Then, the lead pins 53 are connected (fixed) to the printed-circuit board 60 by soldering or the like so as to be connected to at least one of wired lines on front and rear surfaces and another wired line in an inner layer of the printed-circuit board 60.

Further, as shown in FIG. 2B, a socket 70 on which the semiconductor laser device 50 is to be mounted includes a socket main body 71, three terminal connection sections 72 (e.g., connectors), and three terminals 73.

The socket main body 71 is a cylindrical member made of an insulating material, and may be made of resin.

The three terminal connection sections 72 are connected to the respective three terminals 73 in the socket main body 71. Namely, the connections between the terminal connection sections 72 and the lead pins 53 are established by inserting the lead pins 53 into the terminal connection sections 72. For example, those three terminals 73 are connected to an electronic device to drive the semiconductor laser device 50.

Next, the lead pin correction (bending) device according to an embodiment is described.

Figure 3:
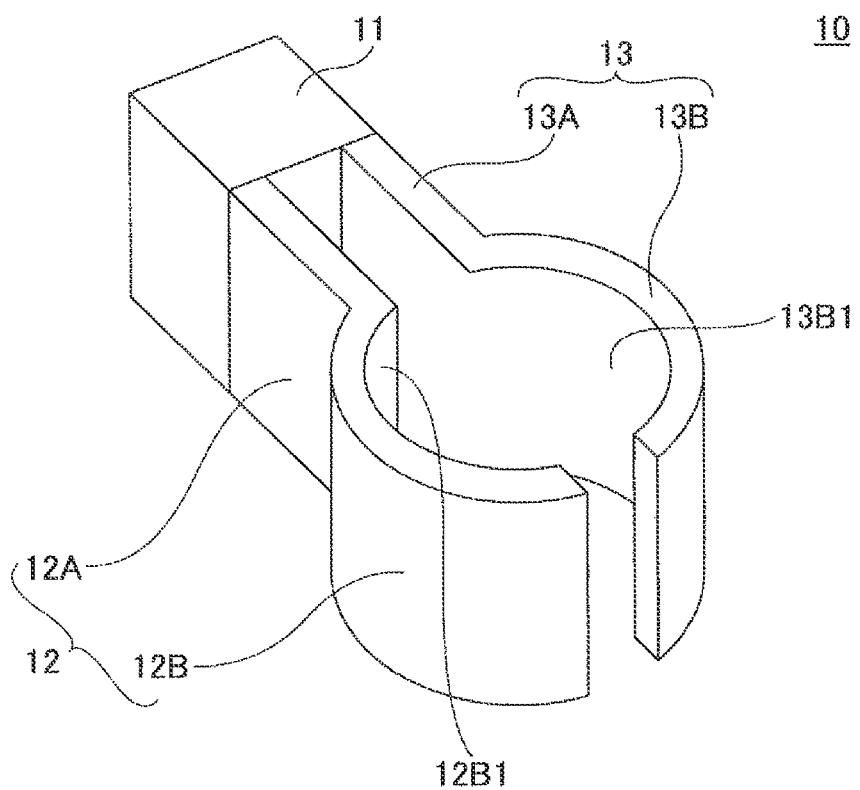
FIG. 3 is a drawing illustrating a sample holder of the lead pin correction (bending) device according to an embodiment.
Figure 4:
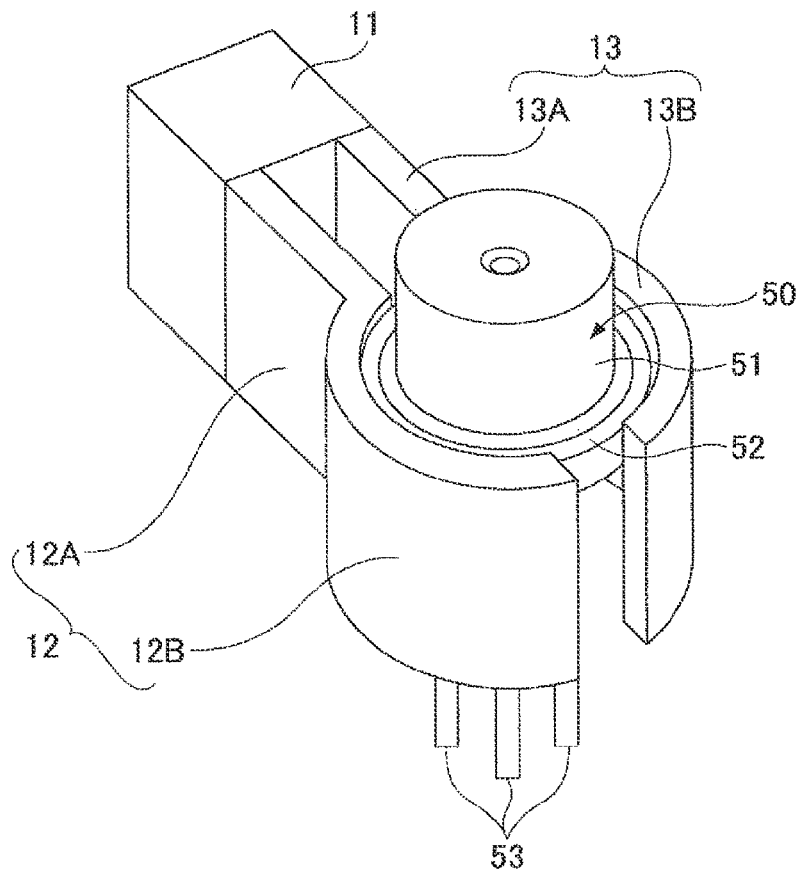
FIG. 4 is a drawing illustrating where the holder holds the semiconductor laser device.

FIG. 3 illustrates a holder 10 included in the lead pin correction (bending) device according to an embodiment. FIG. 4 illustrates a state where the holder 10 holds the semiconductor laser device 50.

Referring back to FIG. 3, the holder 10 includes a base 11 and gripping sections 12 and 13. The holder 10 is an example of a holding unit.

For example, the base 11 and the gripping sections 12 and 13 may be formed with stainless (SUS), and then silicon-based resin is coated on the surface of the stainless. By having the resin coating on the surface of the holder 10, it becomes possible to prevent deterioration and damage by static electricity.

The base 11 serves as a base of the holder 10, and is supported by a device (not shown).

The gripping sections 12 and 13 are fixed to the base 11. The gripping section 12 includes a base part 12A and a curved part 12B. Similarly, the gripping section 13 includes a base part 13A and a curved part 13B. The base parts 12A and 13A are connected (fixed) to the base 11.

The base parts 12A and 13A hold the curved part 12B and 13B, respectively, with respect to the base 11. The curved part 12B and 13B are the parts to hold the stem section 52 of the semiconductor laser device 50. The gripping sections 12 and 13 are held by the base 11 with inner surfaces 12B1 and 13B1 of the respective curved part 12B and 13B facing with each other.

The curvature of the inner surfaces 12B1 and 13B1 of the curved part 12B and 13B is set as the curvature of the stem section 52 of the semiconductor laser device 50. The gripping sections 12 and 13 are formed so as to be bent in the directions to be more separated from each other from the positions when the gripping sections 12 and 13 grip the stem section 52 than in a case where the gripping sections 12 and 13 do not grip the stem section 52.

Namely, the gripping sections 12 and 13 may function as springs to apply a restoring force so as to approach each other while gripping the stem section 52. Therefore, the gripping sections 12 and 13 may grip the stem section 52 of the semiconductor laser device 50 as illustrated in FIG. 4.

For example, the holder 10 may be formed so that the base 11 and the gripping sections 12 and 13 are integrally formed. Otherwise, the holder 10 may be formed so that the gripping sections 12 and 13 are connected to the base 11.

Figure 5:
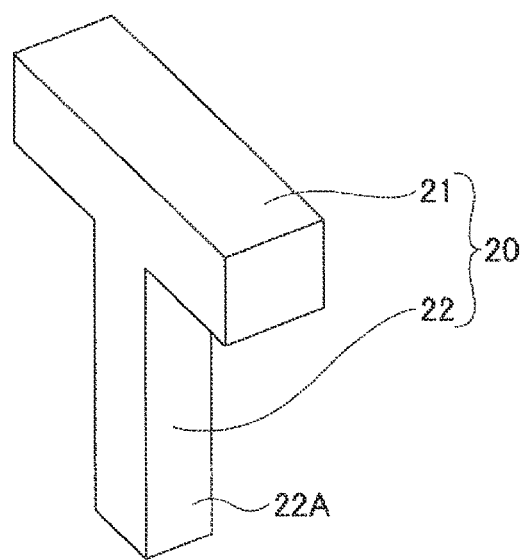
FIG. 5 is a drawing illustrating an example pressing part of the lead pin correction (bending) device according to an embodiment.

FIG. 5 illustrates a pressing part 20 of the lead pin correction (bending) device according to an embodiment.

The pressing part 20 is a T-shaped member when, for example, obliquely viewed. The pressing part 20 includes a base part 21 and an extending part 22.

The base part 21 is a top portion of the T-shaped member, and is in connection with and fixed to a driving device (not shown).

The extending part 22 extends from the middle part of the base part 21, so that the base part 21 along with the extending part 22 form the T-shaped pressing part 20. The extending part 22 has an end part 22A on the side opposite to the base part 21. The end part 22A of the extending part 22 is formed so that the size of the end part 22A is small enough to be inserted into a space formed between the inner surfaces 12B1 and 13B1 of the curved parts 12B and 13B of the gripping sections 12 and 13 of the holder 10.

The pressing part 20 presses the upper surface of the laser section 51 of the semiconductor laser device 50 downward with the end part 22A of the extending part 22, the semiconductor laser device 50 being held by the gripping sections 12 and 13 of the holder 10.

For example, the pressing part 20 may be made of stainless (SUS) and formed by integrally forming the base part 21 and the extending part 22 and coating the surfaces thereof with silicon-based resin. By having the resin coated surfaces of the pressing part 20, it becomes possible to prevent the deterioration and the damage due to static electricity.

Alternatively, the pressing part 20 may be formed by separately forming the base part 21 and the extending part 22 of stainless and connecting the base part 21 with the extending part 22 and coating silicon-based resin on the surfaces of the pressing part 20.

FIGS. 6A through 6D illustrate a correction (bending) fixture 30 of the lead pin correction (bending) device according to an embodiment. More specifically, FIGS. 6A through 6D are a perspective view, a side view, a top view, and a bottom view, respectively, of the lead pin correction (bending) device according to an embodiment.

As illustrated in FIGS. 6A through 6D, the correction (bending) fixture 30 includes three tube parts 31, 32, and 33, and three connection parts 34A, 34B, and 34C.

The tube parts 31, 32, and 33 are hollow tube members and include upper ends 31A, 32A, and 33A and lower ends 31B, 32B, and 33B, respectively.

The tube part 31 includes straight parts 31C, 31D, and 31E, between the upper end 31A and the lower end 31B. The tube part 31 further includes curved parts 31F and 31G which are formed between the straight parts 31C and 31D and between the straight parts 31D and 31E, respectively. The tube part 31 is curved in the curved parts 31F and 31G.

The tube part 32 includes straight parts 32C, 32D, and 32E, between the upper end 32A and the lower end 32B. The tube part 32 further includes curved parts 32F and 32G which are formed between the straight parts 32C and 32D and between the straight parts 32D and 32E, respectively. The tube part 32 is curved in the curved parts 32F and 32G.

The tube part 33 includes straight parts 33C, 33D, and 33E, between the upper end 33A and the lower end 33B. The tube part 33 further includes curved parts 33F and 33G which are formed between the straight parts 33C and 33D and between the straight parts 33D and 33E, respectively. The tube part 33 is curved in the curved parts 33F and 33G.

The tube parts 31, 32, and 33 are separated from each other along the longitudinal direction (i.e., in the direction parallel to the inserting direction of the lead pins 53). The configuration of this is described below with reference to FIG. 7.

Further, as schematically illustrated in FIGS. 6 and 7, the tube parts 31, 32, and 33 are connected to each other via connecting parts 34A, 34B, and 34C, so that the angles between the extending directions of the straight parts 31D, 32D, and 33D are 120 degrees in top and bottom views so that the straight parts 31D, 32D, and 33D are uniformly separated from each other.

The straight part 31C of the tube part 31 is connected to the straight part 32C of the tube part 32 via the connecting part 34A. The straight part 32C of the tube part 32 is connected to the straight part 33C of the tube part 33 via the connecting part 34B, The straight part 33C of the tube part 33 is connected to the straight part 31C of the tube part 31 via the connecting part 34C.

The connecting parts 34A, 34B, and 34C are plate-like members. The connecting part 34A connects the straight part 31C of the tube part 31 and the straight part 32C of the tube part 32. The connecting part 34B connects the straight part 32C of the tube part 32 and the straight part 33C of the tube part 33. The connecting part 34C connects the straight part 33C of the tube part 33 and the straight part 31C of the tube part 31.

The tube parts 31, 32, and 33 are connected to the connecting parts 34A, 34B, and 34C by soldering, welding or the like The tube parts 31, 32, and 33 of the correction (bending) fixture 30 have holes extending from the upper ends 31A, 32A, and 33A to the lower ends 31B, 32B, and 33B, respectively. The shapes of the holes of the tube parts 31, 32, and 33 correspond to the shapes of the lead pins 53 of the semiconductor laser device 50 after the lead pins 53 are corrected (bent).

When the lead pins 53 are corrected (i.e., "When the shapes of the lead pins 53 are corrected"), the lead pins 53 are inserted into the tube parts 31, 32, and 33 from the upper ends 31A, 32A, and 33A of the tube parts 31, 32, and 33. To that end, the distances between the upper ends 31A, 32A, and 33A correspond to the distances between the (distal ends of the) lead pins 53.

Figure 7A:
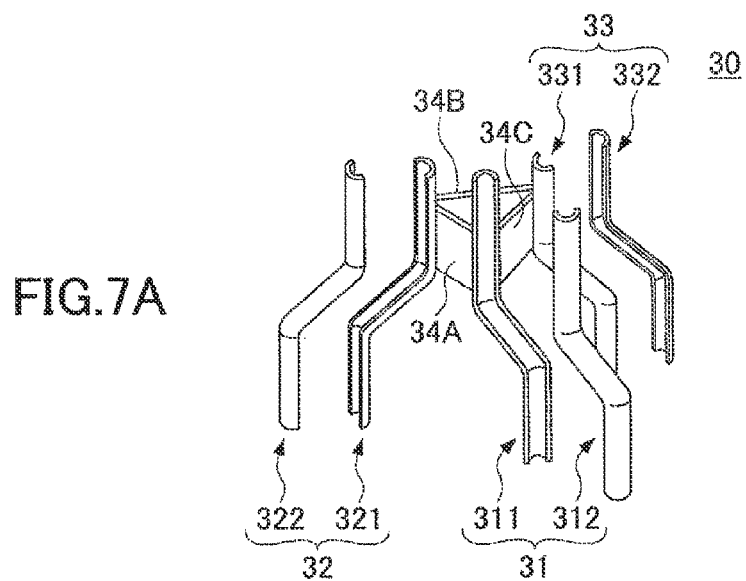
FIGS. 7A through 7D are drawings illustrating a state where the correction fixture is separated (disassembled)
Figure 7B:
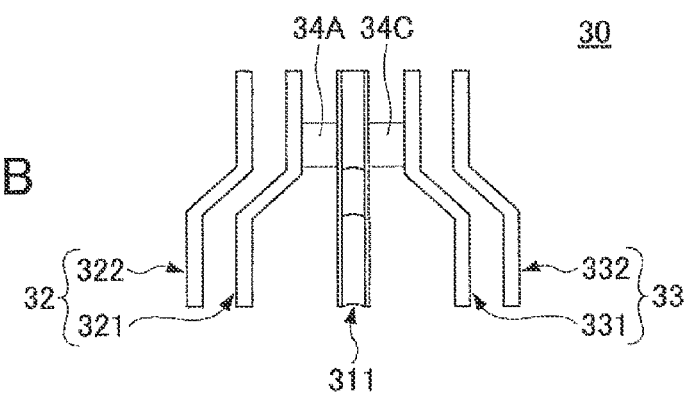
Figure 7C:
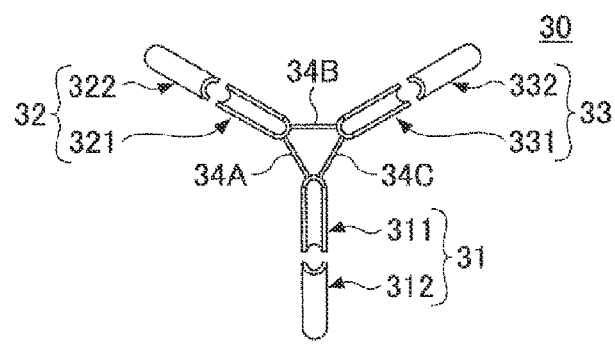
Figure 7D:
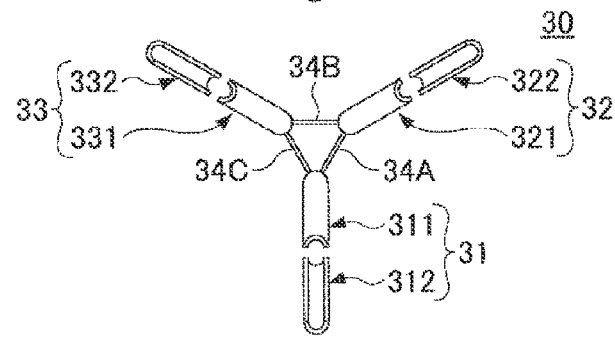

FIGS. 7A through 7D illustrate an open state of the correction (bending) fixture 30 of the lead pin correction (bending) device according to an embodiment. More specifically, FIG. 7A is an exploded perspective view of the correction (bending) fixture 30. FIG. 7B is an exploded side view of the correction (bending) fixture 30. FIG. 7C is an exploded top view of the correction (bending) fixture 30. FIG. 7D is an exploded bottom view of the correction (bending) fixture 30.

To describe the relationships between the tube parts 31, 32, and 33 and the connecting parts 34A, 34B, and 34C, details of the tube parts 31, 32, and 33 are not shown in FIGS. 6A through 6D. However, as illustrated in FIGS. 7A through 7D, each of the tube parts 31, 32, and 33 may be separated into two parts along the longitudinal direction.

Further, the upper ends 31A, 32A, and 33A of the tube parts 31, 32, and 33 are positioned on a same concentric circle.

Similarly, the lower ends 31B, 325, and 33B of the tube parts 31, 32, and 33 are positioned on another same concentric circle.

Here, the circle on which the centers of the tube parts 31, 32, and 33 at the upper ends 31A, 32A, and 33A are located is called a first circle. Similarly, the other circle on which the centers of the tube parts 31, 32, and 33 at the lower ends 31B, 32B, and 33B are located is called a second circle. The diameter of the second circle is greater than that of the first circle.

In top view of the tube part 31, the tube part 31 is separated into two parts (i.e., inner and outer parts) by the first circle at the upper end 31A. Similarly, in top view of the tube part 31, the tube part 31 is separated into two parts (i.e., inner part and outer part) by the second circle at the lower end 31B. Further, the tube part 31 is continually separated into the two parts (i.e., the inner part and the outer part) at any other parts between the upper end 31A and the lower end 31B.

The tube part 31 includes a member 311 and a member 312. The member 311 is the inner part disposed inside of the first circle and the second circle, and the member 312 is the outer part disposed outside of the first circle and the second circle. The member 311 is an example of a first part including a first groove part, and the member 312 is an example of a second part including a second groove part.

Namely, as illustrated in FIGS. 7A through 7D, the tube part 31 is separated into two parts (i.e., the members 311 and 312). Further, by combining the members 311 and 312, the tube part 31 is formed as illustrated in FIGS. 6A through 6D.

In top view of the tube part 32, the tube part 32 is separated into two parts (i.e., the inner part and the outer part) by the first circle at the upper end 32A. Similarly, in top view of the tube part 32, the tube part 32 is separated into two parts (i.e., the inner and the outer parts) by the second circle at the lower end 32B. Further, the tube part 32 is continually separated into the two parts (i.e., inner and outer parts) at any other parts between the upper end 32A and the lower end 32B.

The tube part 32 includes a member 321 and a member 322. The member 321 is the inner part disposed inside of the first circle and the second circle, and the member 322 is the outer part disposed outside of the first circle and the second circle. The member 321 is an example of the first part including the first groove part, and the member 322 is an example of the second part including the second groove part.

Namely, as illustrated in FIGS. 7A through 7D, the tube part 32 is separated into two parts (i.e., the members 321 and 322). Further, by combining the members 321 and 322, the tube part 32 is formed as illustrated in FIGS. 6A through 6D.

In top view of the tube part 33, the tube part 33 is separated into two parts (i.e., the inner part and the outer part) by the first circle at the upper end 33A. Similarly, in top view of the tube part 33, the tube part 33 is separated into two parts (i.e., the inner and the outer parts) by the second circle at the lower end 33B. Further, the tube part 33 is continually separated into the two parts (i.e., inner and outer parts) at any other parts between the upper end 33A and the lower end 33B.

The tube part 33 includes a member 331 and a member 332. The member 321 is the inner part disposed inside of the first circle and the second circles, and the member 332 is the outer part disposed outside of the first circle and the second circle. The member 331 is an example of the first part including the first groove part, and the member 332 is an example of the second part including the second groove part.

Namely, as illustrated in FIGS. 7A through 7D, the tube part 33 is separated into two parts (i.e., the members 331 and 332). Further, by combining the members 331 and 332, the tube part 33 is formed as illustrated in FIGS. 6A through 6D.

In the correction (bending) fixture 30, the member 311 is connected to the member 321 via the connecting part 34A. Similarly, the member 321 is connected to the member 331 via the connecting part 34B, and the member 331 is connected to the member 311 via the connecting part 34C.

The members 312, 322, and 332 are driven by a driving device (not shown) so that the members 312, 322, and 332 can move between the positions where the members 312, 322, and 332 are in contact with the members 311, 321, and 331 and the positions where the members 312, 322, and 332 are separated from the members 311, 321, and 331, respectively.

Further, the members 311 and 312 may be formed by bending one tube part 31 at the curved parts 31F and 31G and then cutting the bent tube part 31 into the two parts along the longitudinal direction. Otherwise, the members 311 and 312 may be formed separately.

Similarly, the members 321 and 322 may be formed by bending one tube part 32 at the curved parts 32F and 32G and then cutting the bent tube part 32 into the two parts along the longitudinal direction. Otherwise, the members 321 and 322 may be formed separately.

The members 331 and 332 may be formed by bending one tube part 33 at the curved parts 33F and 33G and then cutting the bent tube part 33 into the two parts along the longitudinal direction. Otherwise, the members 331 and 332 may be formed separately.

Further, the tube parts 31, 32, and 33 may be formed using, for example, stainless (SUS) and by coating silicon-based resin on the surfaces of the tube parts. By coating resin on the surfaces of the tube parts 31, 32, and 33, it becomes possible to prevent the deterioration and the damage due to static electricity.

Next, a method of correcting (bending) the shapes of the lead pins 53 of the semiconductor laser device 50 using a lead pin correction (bending) device according to an embodiment is described with reference to FIGS. 8 through 11.

Figure 8:
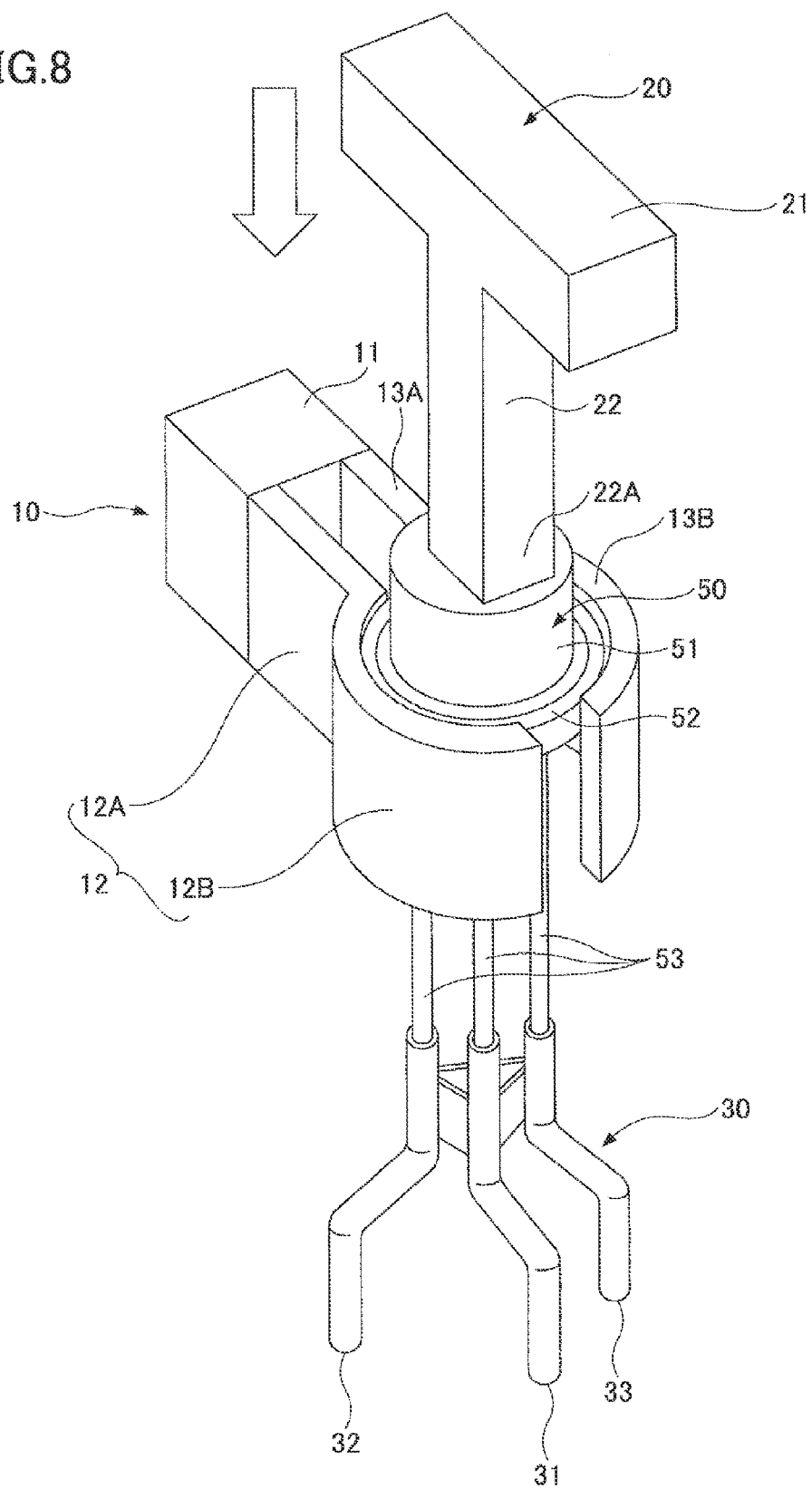
FIG. 8 is a drawing illustrating a process of correcting (bending) the lead pins using the lead pin correction (bending) device according to an embodiment.
Figure 9:
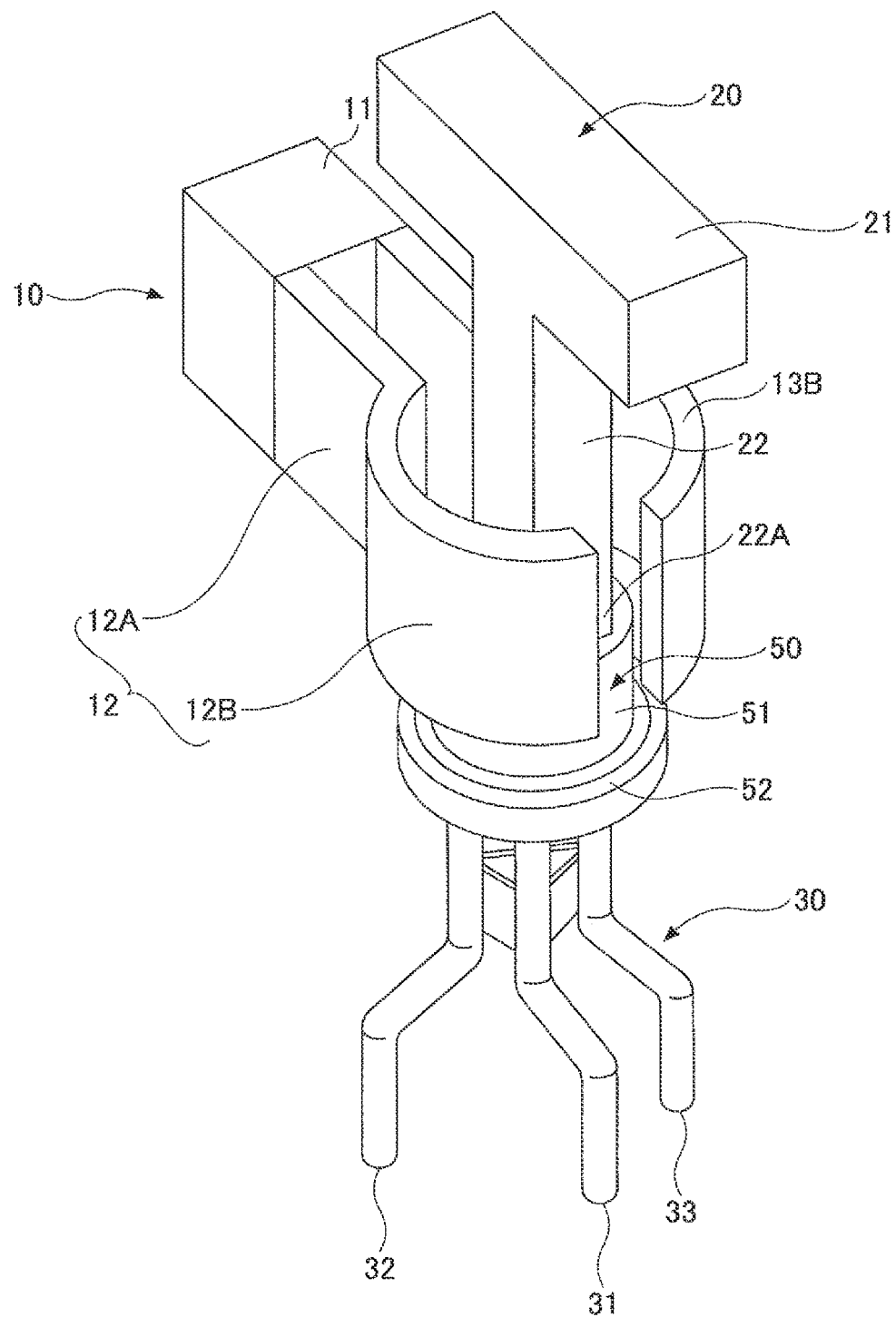
FIG. 9 is another drawing illustrating the process of correcting (bending) the lead pins using the lead pin correction (bending) device according to the embodiment.
Figure 10:
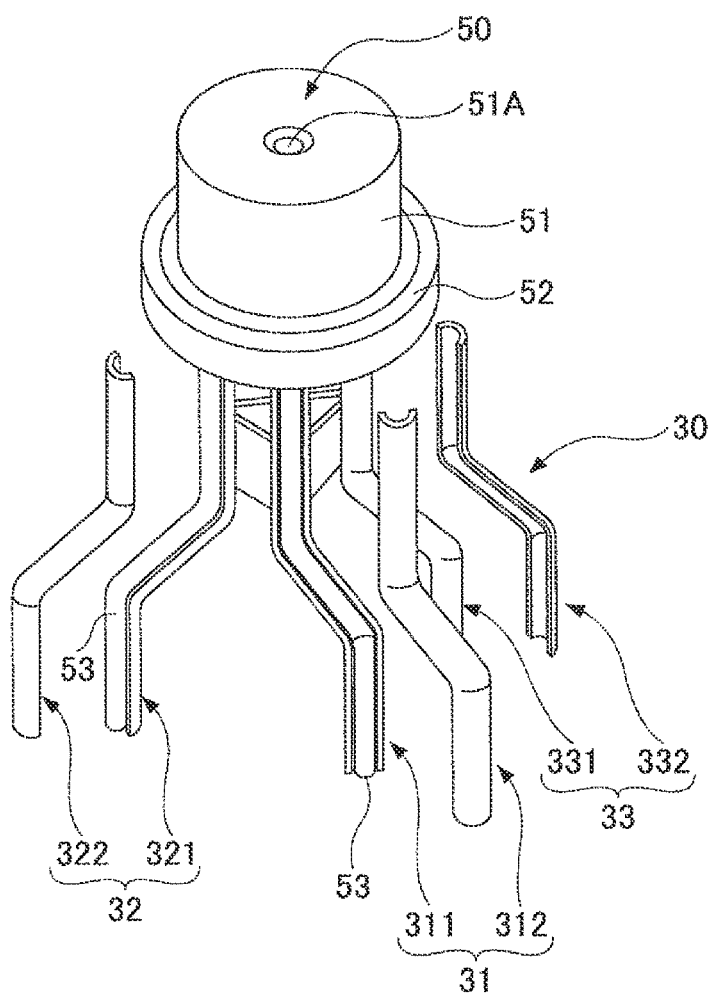
FIG. 10 is still another drawing illustrating the process of correcting (bending) the lead pins using the lead pin correction (bending) device according to the embodiment.
Figure 11:
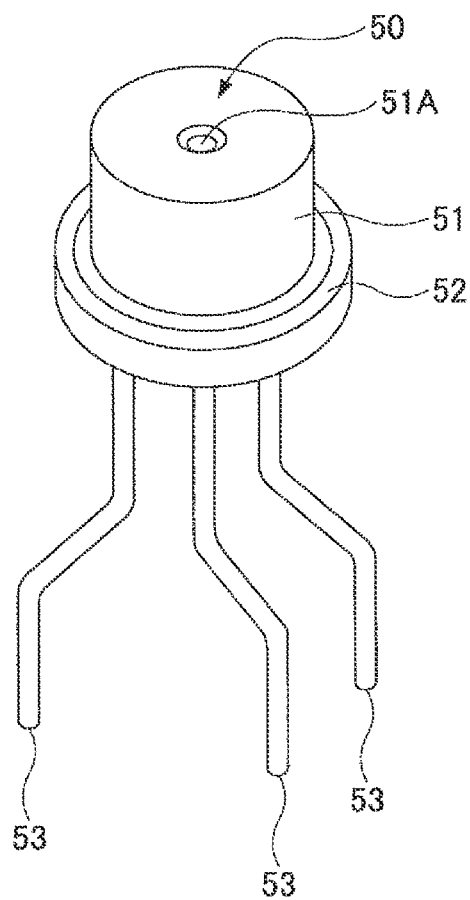
FIG. 11 is a perspective view of the semiconductor laser device having the lead pins corrected (bent) by the lead pin correction (bending) device according to the embodiment.

FIGS. 8 through 10 illustrate processes of correcting (bending) the shapes of the lead pins 53 using the lead pin correction (bending) device according to an embodiment. FIG. 11 obliquely illustrates the semiconductor laser device 50 having the lead pins that have been corrected by the lead pin correction (bending) device according to the embodiment.

As schematically illustrated in FIG. 8, the semiconductor laser device 50 is held by the holder 10, and the distal ends of the lead pins 53 of the semiconductor laser device 50 are inserted into the correction (bending) fixture 30. In this case, the lead pins are inserted into the straight parts 31C, 32C, and 33C of the tube parts 31, 32, and 33.

Namely, in this state, the distal ends of the lead pins 53 are located upper side of the curved parts 31F, 32F, and 33F or in contact with the inner walls of the curved parts 31F, 32F, and 33F.

Further, in this state, a driving device is driven to lower the pressing part 20, so that the end part 22A of the extending part 22 is in contact with the upper surface of the laser section 51 of the semiconductor laser device 50.

Further, the positional adjustments of the lead pins 53 relative to the tube parts 31, 32, and 33 may be performed by detecting the positions of the lead pins 53 by image processing and matching the detected positions with the positions on the image which is used as a reference representing the positions of the tube parts 31, 32, and 33. However, the positional adjustment of the lead pins 53 relative to the tube parts 31, 32, and 33 may be performed based on any other known method.

Next, by further lowering the pressing part 20 by the driving device, the semiconductor laser device 50 is pressed downward. In this case, the stem section 52 of the semiconductor laser device 50 is moved downward along the inner surfaces 12B1 and 13B1 of the curved part 12B and 13B of the gripping sections 12 and 13 of the holder 10, so that the lead pins 53 are pushed deeper inside the tube parts 31, 32, and 33.

FIG. 9 schematically illustrates a state where the semiconductor laser device 50 is fully pushed down by the pressing part 20. In this state, the lead pins 53 are inserted as low as to the lower ends of the tube parts 31, 32, and 33 of the correction (bending) fixture 30.

Next, as schematically illustrated in FIG. 10, the members 312, 322, and 332 of the tube parts 31, 32, and 33 are driven by a driving device so as to be separated from the members 311, 321, and 331, respectively. By doing this, it becomes possible to remove the semiconductor laser device 50 from the correction (bending) fixture 30. By removing the semiconductor laser device 50 from the correction (bending) fixture 30 by using a driving device (not shown) while the stem section 52 is held, the semiconductor laser device 50 including the lead pins 53 having the corrected shapes is obtained as illustrated in FIG. 11.

By doing as described above, a process of correcting (bending) the lead pins by using the lead pin correction (bending) device according to the embodiment is completed.

After the correction of the shapes of the lead pins 53, the distal ends of the lead pins 53 are located on the second circle with the lower ends 31B, 32B, and 33B of the tube parts 31, 32, and 33 of the correction (bending) fixture 30. Namely, the distal ends of the lead pins 53 are extended radially from the positions on the first circle to the positions on the second circle due to the correction by the lead pin correction (bending) device according to the embodiment.

As described above, by using the lead pin correction (bending) device according to the embodiment, it becomes possible to effectively correct the shapes of the lead pins 53 of the semiconductor laser device 50.

In a conventional method, it is necessary to hold the root of the lead pins with the clamp section. Therefore, the configuration of the device is complicated and the cost of the device is higher. Moreover, the shape of the lead pins are corrected one by one. Therefore, the efficiency of correcting (bending) the lead pins is also low.

On the other hand, in the lead pin correction (bending) device according to the embodiment, the configuration of the device including the correction (bending) fixture 30 is simple and it is possible to correct (bend) the plural lead pins at the same time within a single process. Therefore, it becomes possible to effectively correct the lead pins 53 of the semiconductor laser device 50.

Further, the lead pins 53 may be more effectively corrected with a less complicated configuration including the correction (bending) fixture 30. Therefore, the manufacturing cost of the lead pin correction (bending) device may be reduced.

Further, the shape of the lead pins 53 after correction depends on the shape of the correction (bending) fixture 30. Therefore, it becomes possible to accurately correct the shapes of the lead pins 53. Especially, when there are plural lead pins 53, it becomes possible to equalize the shapes, accuracies and the like of the lead pins 53. As a result, it may become possible to acquire high-quality read images, so as to provide an image forming apparatus having higher productivity.

Figure 6A:
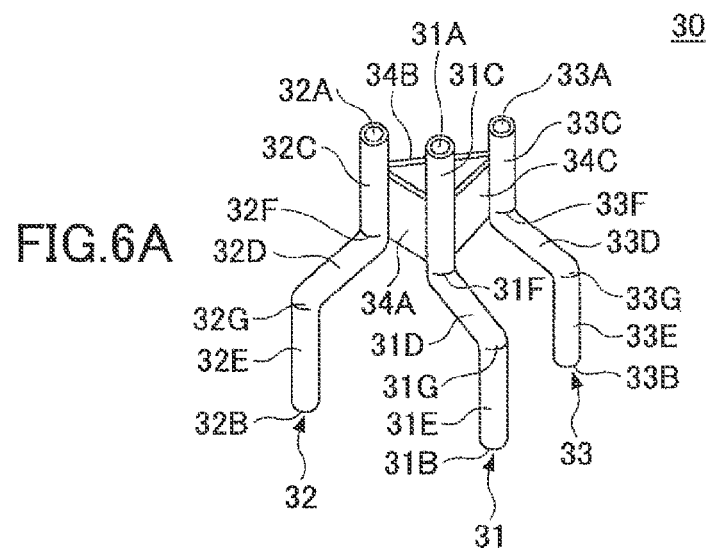
FIGS. 6A through 6D are drawings illustrating a correction fixture (bending jig) of the lead pin correction (bending) device according to an embodiment.
Figure 6B:
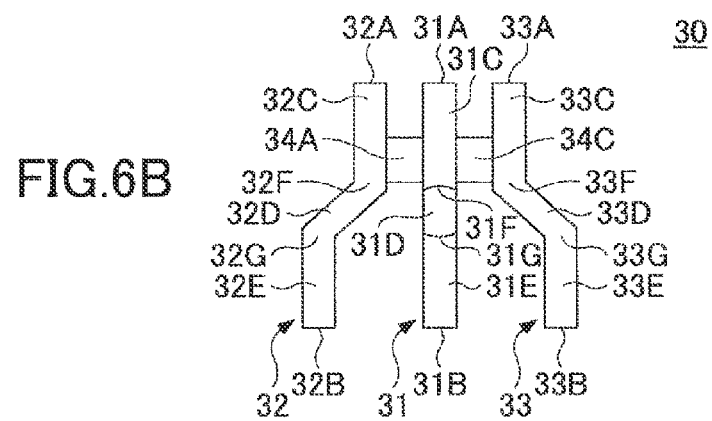
Figure 6C:
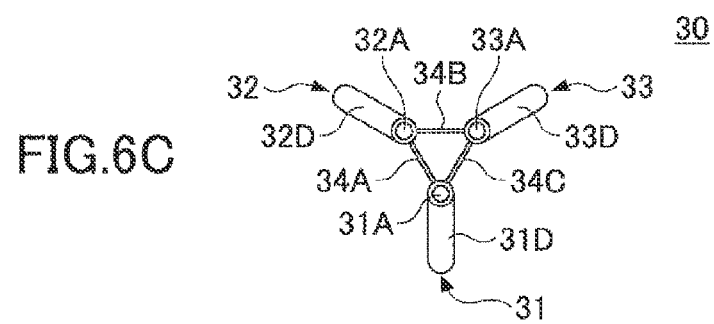
Figure 6D:
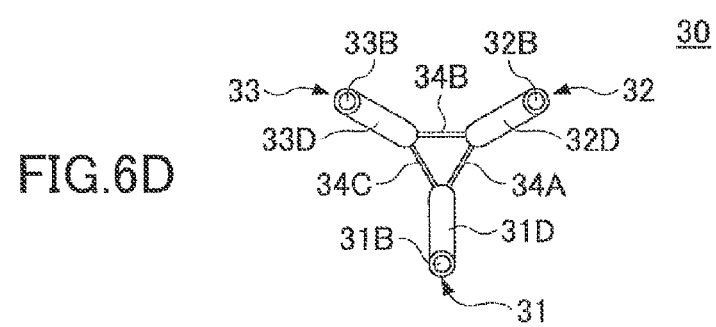

Further, on the upper ends 31A, 32A, and 33A side of the tube parts 31, 32, and 33 of the correction (bending) fixture 30, there are the straight parts 31C, 32C, and 33C that straightly guide the lead pins 53 before the correction (see FIGS. 6A and 6B). The feature of straightly guiding the lead pins 53 before the correction is to straightly guide the lead pins 53 without correction.

Therefore, the lead pins 53 may be held by the straight parts 31C, 32C, and 33C before being bent (corrected) on the lower ends 31B, 32B, and 33B side below the curved parts 31F, 32F, and 33F.

Therefore, it may become possible to reduce the excessive stress applied to the root (i.e., on the stem section 52 side) when the lead pins 53 are bent on the lower ends 31B, 32B, and 33B side below the curved parts 31F, 32F, and 33F. Accordingly, for example, it may become possible to prevent the damage to the semiconductor laser device 50.

In the above description, a case is described where the number of the tube parts 31, 32, and 33 of the correction (bending) fixture 30 is three. However, the number of the tube parts may be changed so as to be the same as the number of the lead pins 53 of the semiconductor laser device 50. Therefore, the correction (bending) fixture 30 may include any number of the tube parts.

Further, in the above description, a case is described where the shape of the tube parts 31, 32, and 33 of the correction (bending) fixture 30 is symmetric. However, the shape of the tube parts may be asymmetric so as to fit the desired shape of the lead pins after correction, so that the shapes of the tube parts may differ from each other.

Further, in the above description, a case is described where the correction (bending) fixture 30 includes the tube parts 31, 32, and 33. However, for example, the correction (bending) fixture 30 may be formed as a metal mold having the holes similar to the holes of the tube parts 31, 32, and 33 without having the above-described tube parts.

In this case, for example, a pair of metal molds so as to form the groove similar to that formed by the members 311 and 312 may be used as the tube part 31. In the same manner, a pair of metal molds so as to form the groove similar to that formed by the members 321 and 322 may be used as the tube part 32. Further, a pair of metal molds so as to form the groove similar to that formed by the members 331 and 332 may be used as the tube part 33.

Further, in the above description, a case is described where the tube parts 31, 32, and 33 are separated into inner members 311, 321, and 331 disposed at an inner side of the first and the second circles and the outer members 312, 322, and 332 disposed at an outer side of the first and the second circles. However, the separation method of separating the tube parts 31, 32, and 33 is not limited to the method described above.

Namely, as long as the corrected lead pins 53 may be removed from the correction (bending) fixture 30 due to the separation of tube parts 31, 32, and 33 in the longitudinal direction (i.e., in the inserting direction of the lead pins 53), any separation method other than the separation method as illustrated in FIGS. 7A through 7D may also be used.

Further, in the above description, an embodiment is described where the members 312, 322, and 332 of the tube parts 31, 32, and 33 are moved by a driving device so as to be separated from the members 311, 321, and 331, respectively. However, for example, the members 312, 322, and 332 may be connected by hinges to the members 311, 321, and 331 so as to be open and closed relative to the members 311, 321, and 331, respectively.

Further, in the above description, an embodiment is described where after the shapes of the lead pins 53 are corrected, the correction (bending) fixture 30 is removed from the lead pins 53. However, for example, after the shapes of the lead pins 53 are corrected, the correction (bending) fixture 30 may be used as the covers covering the lead pins 53 without removing the correction (bending) fixture 30 from the lead pins 53.

Further, a case is described where the holder 10 including the base 11 and the gripping sections 12 and 13 is used. However, as long as the semiconductor laser device 50 may be held during the correction of the shapes of the lead pins 53, the holder may have any shape or configuration other than those as described above.

Further, a case is described where the T-shaped pressing part 20 including the base part 21 and the extending part 22 is used. However, as long as it is possible to press the semiconductor laser device 50 during the correction of the shapes of the lead pins 53, the pressing part may have any shape or configuration other than those as described above.

Further, a case is described where the pressing part 20 and the correction (bending) fixture 30 are moved by using the driving devices. However, for example, the pressing part 20 and the correction (bending) fixture 30 may be moved (driven) by an operator.

Further, in the above description, an embodiment is described where the shapes of the lead pins 53 of the semiconductor laser device 50 are corrected. However, it should be noted that the lead pin correction (bending) device according to an embodiment may also be used for any other electronic devices having lead pins 53. Such electronic devices include a transistor, a three-terminal regulator and the like.

Further, in the above description, examples of the lead pin correction (bending) device and a lead pin correction (bending) method according to embodiments are described.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:

1. A lead pin correction device comprising:
   a holding unit configured to hold an electronic device having lead pins including distal ends;
   a pressing unit configured to press the electronic device held by the holding unit in an extending direction of the lead pins; and
   a correction fixture disposed below the holding unit and including tube members having a shape corresponding to a shape of the lead pins after correction,
   wherein the tube members of the correction fixture have a bending shape, and
   wherein a shape of the lead pins before correction is corrected so as to fit the bending shape of the tube members by inserting the lead pins into the tube members by pressing the electronic device with the pressing unit while the distal ends of the lead pins are inserted into the tube members, the electronic device being held by the holding unit.

2. The lead pin correction device according to claim 1, wherein the tube members of the correction fixture include respective straight parts at ends of the tube members where the lead pins are inserted, so that the lead pins before correction are substantially straight upon insertion into the respective straight parts.

3. The lead pin correction device according to claim 1, wherein the tube members of the correction fixture are separated along an insertion direction of the lead pins.

4. The lead pin correction device according to claim 3,
wherein the correction fixture includes a first tube part and a second tube part, the first tube part including first grooves, the second tube part including second grooves, and
wherein the tube members are formed when the first tube part is in contact with the second tube part so that the first grooves and the second grooves constitute the tube members.

5. The lead pin correction device according to claim 1,
wherein the correction fixture includes a first tube part and a second tube part, the first tube part including first grooves, the second tube part including second grooves, and
wherein the tube members are formed when the first tube part is in contact with the second tube part so that the first grooves and the second grooves constitute the tube members.

6. A lead pin correction method comprising:
holding an electronic device having lead pins including distal ends, with a holding unit;
pressing the electronic device in an extending direction of the lead pins with a pressing unit, the electronic device being held by the holding unit;
inserting the distal ends of the lead pins into tube members of a correction fixture, a shape of the tube members corresponding to a shape of the lead pins after correction; and
inserting the lead pins into the tube members by pressing the electronic device with the pressing unit, the electronic device being held by the holding unit,
wherein the tube members of the correction fixture have a bending shape.

7. The lead pin correction method according to claim 6,
wherein the correction fixture includes a first tube part and a second tube part, the first tube part including first grooves, the second tube part including second grooves, and
wherein the tube members are formed when the first tube part is in contact with the second tube part so that the first grooves and the second grooves constitute the tube members.

8. A lead pin correction device comprising:
a holding unit configured to hold an electronic device having lead pins including distal ends;
a pressing unit configured to press the electronic device held by the holding unit in an extending direction of the lead pins; and
a correction fixture disposed below the holding unit and including tube members having a shape corresponding to a shape of the lead pins after correction,
wherein a shape of the lead pins before correction is corrected so as to fit the shape of the tube members by inserting the lead pins into the tube members by pressing the electronic device with the pressing unit while the distal ends of the lead pins are inserted into the tube members, the electronic device being held by the holding unit, and
wherein the correction fixture includes a first tube part and a second tube part, the first tube part including first grooves, the second tube part including second grooves, and
wherein the tube members are formed when the first tube part is in contact with the second tube part so that the first grooves and the second grooves constitute the tube members.

* * * * *